United States Patent
Schäfer et al.

(10) Patent No.: US 11,081,465 B2
(45) Date of Patent: Aug. 3, 2021

(54) METHOD FOR PRODUCING A STABLE SANDWICH ARRANGEMENT OF TWO COMPONENTS WITH SOLDER SITUATED THEREBETWEEN

(71) Applicant: Heraeus Deutschland GmbH & Co. KG, Hanau (DE)

(72) Inventors: Michael Schäfer, Kunzell (DE); Wolfgang Schmitt, Rodgau (DE)

(73) Assignee: HERAEUS DEUTSCHLAND GMBH & CO. KG, Hanau (DE)

( * ) Notice: Subject to any disclaimer, the term of this patent is extended or adjusted under 35 U.S.C. 154(b) by 0 days.

(21) Appl. No.: 16/629,770

(22) PCT Filed: Oct. 29, 2018

(86) PCT No.: PCT/EP2018/079563
§ 371 (c)(1),
(2) Date: Jan. 9, 2020

(87) PCT Pub. No.: WO2019/115081
PCT Pub. Date: Jun. 20, 2019

(65) Prior Publication Data
US 2021/0111149 A1     Apr. 15, 2021

(30) Foreign Application Priority Data
Dec. 13, 2017 (EP) ..................... 17207044

(51) Int. Cl.
*H01L 23/00* (2006.01)
(52) U.S. Cl.
CPC .............. *H01L 24/83* (2013.01); *H01L 24/27* (2013.01); *H01L 2224/83801* (2013.01); *H01L 2924/0105* (2013.01)

(58) Field of Classification Search
None
See application file for complete search history.

(56) References Cited

U.S. PATENT DOCUMENTS

| 3,883,946 A | 5/1975 | Dale |
| 4,659,006 A | 4/1987 | Polansky |

FOREIGN PATENT DOCUMENTS

| DE | 102013213135 B3 | 8/2014 |
| JP | 2002001520 A | 1/2002 |

OTHER PUBLICATIONS

International Search Report issued in PCT/EP2018/079563 dated Jan. 9, 2019.

*Primary Examiner* — Moazzam Hossain
*Assistant Examiner* — Stanetta D Isaac
(74) *Attorney, Agent, or Firm* — Blank Rome LLP

(57) ABSTRACT

A method for producing a stable sandwich arrangement of two components with solder situated therebetween, comprising the steps:
(1) providing two components, each having at least one contact surface, and a free solder preform,
(2) producing a sandwich arrangement of the components and a solder preform arranged between them and thus not yet connected to them by bringing into contact (i) each one of the contact surfaces, (ii) each of the single contact surface of the components or (iii) one of the contact surfaces of one component and a single contact surface of the other component, with the contact surfaces of the free solder preform, and
(3) hot-pressing the sandwich arrangement produced in step (2) so as to form the stable sandwich arrangement at a temperature being at 10 to 40% below the melting temperature of the solder metal of the solder preform, expressed in ° C.

19 Claims, No Drawings

METHOD FOR PRODUCING A STABLE SANDWICH ARRANGEMENT OF TWO COMPONENTS WITH SOLDER SITUATED THEREBETWEEN

This application is a national stage of International Patent Application No. PCT/EP2018/079563, filed Oct. 29, 2018, which claims the benefit of European Application No. 17207044.3, filed Dec. 13, 2017, each of which are hereby incorporated herein by reference in their entirety.

The invention relates to a method for producing a stable sandwich arrangement of two components with solder situated therebetween.

The term used herein, a "stable sandwich arrangement of two components with solder situated therebetween", also shortly referred to as a "stable sandwich arrangement" means that the two components, given with the solder therebetween, adhere to one another with a shear strength of >0.1 MPa; in other words, they have a shear strength of >0.1 MPa, describing the adhesive strength to one another. The shear strength can be determined by means of a conventional shear tester.

U.S. Pat. No. 4,659,006 discloses connecting a substrate to a free solder preform by hot pressing as a substep of a method for producing a braze joint between a semiconductor chip and a substrate. When connecting a substrate to a free solder preform, the substrate and solder preform are first brought into contact with one another and then heated together at a temperature below the melting temperature of the solder preform. During the action of this temperature, a pressing pressure is exerted on the solder preform. In doing so, the original thickness of the solder preform is reduced by at least 40%. Subsequently, the arrangement of the solder-deposited substrate created in this manner is soldered to a semiconductor chip in a conventional manner.

Here, a distinction is made deliberately between a solder joint and a braze joint of components. While both solder joint as well as braze joint cause a thermally conductive, electrically conductive and mechanical connection of components, the difference between a solder joint and a braze joint is that the solder metal is melted and solidified again in the formation of a braze joint unlike the formation of a solder joint between the components, in other words, heated above its melting temperature and then cooled below its solidification temperature.

The Applicant has now surprisingly found that the production of a solder joint between components, for example, between a semiconductor chip and a substrate, succeeds with hot pressing in a process step.

The invention relates to a method for producing a stable sandwich arrangement of two components with solder situated therebetween, i.e., solder, thermally conductively, electrically conductively and mechanically connecting two components. The method comprises the steps:

(1) providing two components, each having at least one contact surface, and a free solder preform, (2) producing a sandwich arrangement of the components and a solder preform, arranged between them and thus not yet bonded to them, by bringing into contact (i) each one of the contact surfaces, (ii) each of the single contact surface of the components or (iii) one of the contact surfaces of one component and a single contact surface of the other component, with the contact surfaces of the free solder preform, and (3) hot-pressing the sandwich arrangement produced in step (2) so as to form the stable sandwich arrangement at a temperature being at 10 to 40% below the melting temperature of the solder metal of the solder preform, expressed in ° C.

In step (1) of the method, two components, each having at least one contact surface, and a free solder preform are provided.

In the context of the invention, the term component should preferably comprise individual parts. Preferably, these individual parts cannot be further dismantled.

The contact surface(s) of components are generally metallic, for example, in the form of a metallization layer. The metal of a component or its contact surface(s) may be pure metal or an alloy of >50 to <100 wt.-% of the metal and, accordingly, >0 to <50 wt.-% of at least one other metal. The examples of the pure metal or the alloy main metal are tin, copper, silver, gold, nickel, palladium and platinum, in particular tin, copper, silver, gold, palladium and platinum.

The contact surfaces of the components used in step (2) in the production of the sandwich arrangement may have a size, for example, in the range of 1 to 3000 mm$^2$, in particular >10 to 1000 mm$^2$, especially 15 to 500 mm$^2$.

A component according to the invention may be a substrate or an active or a passive component. In particular, it is a component such as used in electronics.

The examples of substrates are IMS-substrates (insulated metal substrates), DCB-substrates (direct copper bonded-substrates), AMB-substrates (active metal braze-substrates), ceramic substrates, PCBs (printed circuit boards) and lead frames.

The examples of active components are diodes, LED (light emitting diodes), dies (semiconductor chips), IGBT (insulated-gate bipolar transistors, bipolar transistors with insulated gate-electrode), IC (integrated circuits), and MOSFET (metal-oxide-semiconductor field-effect transistors).

The examples of passive components are sensors, base plates, heat sink, resistors, capacitors, transformers, chokes and coils.

The two components provided in step (1) may be of the same type, i.e., for example, in both cases they can be substrates, or they can be active or passive components or an active and a passive component. However, it may also be that the one component is a substrate and the other component is an active or passive component. For example, the following cases can be distinguished:

| First component | The other component |
| --- | --- |
| Substrate | Substrate |
| Active component | Passive component |
| Passive component | Active component |
| Active component | Active component |
| Passive component | Passive component |
| Substrate | Active component |
| Substrate | Passive component |
| Passive component | Substrate |
| Active component | Substrate |

In addition to the components having at least one contact surface, in step (1) of the method, a free, i.e., discrete solder preform is provided.

In the context of the invention, the free solder preform is, in particular, solder metal in the form of a flat molded part, for example, soldered metal foil, soldered metal strip or a soldered metal platelet. Such free solder preforms have discrete contact surfaces, i.e., separate and distinguishable contact surfaces from one another, in particular two contact surfaces arranged on opposite sides. The shape of the contact surfaces can be arbitrary, for example, round, hexagonal, triangular, preferably rectangular. Size and shape preferably correspond to the contact surface of the component. The thickness of the free solder preform can, for example, be in the range of 10 to 500 μm or 50 to 300 μm.

The solder metal (solder) of the solder preform is generally indium, indium alloys or, in particular tin or tin-rich alloys. The examples of tin-rich alloys are those having a tin content, for example, in the range of 90 to 99.5 wt.-% (weight %). The examples of alloying metals are copper, silver, indium, germanium, nickel, lead, bismuth and antimony. The alloys may be leaded or lead free. Lead-free alloys may, for example, be selected from the group consisting of SnAg, SnBi, SnSb, SnAgCu, SnCu, SnSb, InSnCd, InBiSn, InSn, BiSnAg or SnAgCuBiSbNi.

For example, lead-containing alloys may be selected from the group comprising SnPb and SnPbAg. The melting temperature of the solder metal may, for example, be in the range of 140 to 380° C., in particular 170 to 300° C.

In step (2) of the method according to the invention, a sandwich arrangement is produced from the components and a solder preform arranged therebetween and thus not yet connected, either (i) by bringing into contact each one of the contact surfaces of the components with the contact surfaces of the free solder preform, (ii) by bringing into contact each of the single contact surface of the components with the contact surfaces of the free solder preform, or (iii) by bringing into contact one of the contact surfaces of one component and a single contact surface of the other component, with the contact surfaces of the free solder preform.

The bringing into contact can be done, for example, by placing one of the contact surfaces of the free solder preform with the relevant contact surface of one component and its other contact surface with the relevant contact surface of the other component. In general, placing the free solder preform means applying it on one component, followed by applying the still missing component on the solder preform. Instead of applying it, it can also be tipped.

In one embodiment, a fixing agent of a fixing agent composition may be used between the respective contact surfaces to be brought into contact with one another, or applied to one or both of the respective contact surfaces prior to bringing into contact with one another.

In step (3) of the method according to the invention, the sandwich arrangement produced in step (2) is subjected to a hot pressing, in which the components and solder preform are connected to form a stable sandwich arrangement. In this case, a solder joint is formed between the components.

As a working device, for example, a conventional hot press can be used.

The hot pressing takes place at a temperature being at 10 to 40% below the melting temperature of the solder metal of the solder preform, expressed in ° C. Concretely, for example, the melting temperature of the solder metal may be in the range of 140 to 380° C., and for example, the temperature during hot pressing may be in the range of 84 to 342° C.

In a preferred embodiment of the method according to the invention, the combination of pressing pressure and pressing time acting during the hot pressing may be within a range, which causes a reduction of the original thickness of the original free solder preform (i.e., the solder preform in its original free state) by ≤10%. Depending on the original thickness of the original free solder preform provided in step (1), said thickness reduction by ≤10% may, for example, be in the range of 0 to 50 μm.

The combination of pressing pressure and pressing time, which causes a reduction of the original thickness of the original free solder preform by 0% at a temperature being at 10 to 40% below the melting temperature of the solder metal of the solder preform, expressed in ° C., may, for example, be in the range of 10 to 200 MPa pressing pressure and 1 second to 5 minutes pressing time. The higher the selected pressing pressure, the shorter the pressing time can be selected and vice versa.

The method according to the invention operates with significantly milder hot-pressing conditions than those disclosed in the aforementioned U.S. Pat. No. 4,659,006. In the form of the stable sandwich arrangement formed according to the invention, it achieves a sufficiently firm connection of components and original free solder preform.

As mentioned above, the method according to the invention has various advantages, both with regard to the actual method implementation and with regard to the direct process product in the form of the stable sandwich arrangement of the two components with solder situated therebetween.

The method according to the invention can be carried out with a comparatively simply built hot presser.

The method according to the invention can also be carried out with more pressure-sensitive components other than those disclosed in the aforementioned U.S. Pat. No. 4,659,006.

In the embodiments, the method according to the invention or the hot pressing can even be carried out in a normal ambient atmosphere without taking any special precautions, that is in the air, i.e., it is neither necessary to work under inert gas nor in a reducing atmosphere such as an inert gas/hydrogen atmosphere.

The former solder preform connecting the components after the completion of the inventive method according to the preferred embodiment (i.e., the solder joint produced according to the preferred embodiment of the method according to the invention) is characterized not only by a reduced thickness 0% less than the original thickness of the original free solder preform, but also by substantially unchanged shape and area measured with respect to the origin, after the completion of hot pressing. Thus, substantially no bulges occur at the outer edges of the solder connecting the components, an advantageous fact with regard to a progressive miniaturization in the electronics sector and thus the concomitant increase in the component density. For example, originally rectangular free solder preforms also remain substantially rectangular with substantially straight lines, even in the form connected to the components, i.e., substantially, not curved outer edges. The term "substantially" used in this paragraph refers to viewing with the naked eye.

Upon the completion of step (3), a stable sandwich arrangement is obtained from the two components provided in step (1) with the solder, thermally conductively, electrically conductively and mechanically connecting the two components therebetween. This solder is a solder joint.

The stable sandwich arrangement has a strength which ensures at least transportability (for example, on the way to further handling) or even a higher strength which does not require subsequent soldering (post-soldering). In this respect, it may be appropriate or necessary or even simply desired, to complete a conventional soldering process after the completion of step (3). In the case of conventional soldering known to the person skilled in the art and therefore requiring no further explanation, the following steps follow the method according to the invention:

(4) heating the stable sandwich arrangement to a temperature above the melting temperature of the solder metal of the solder joint connecting the two components, and (5) cooling the sandwich arrangement below the solidification temperature of the molten solder metal situated between the components, so as to form a braze joint between the components.

In step (4) it is a soldering.

After the completion of step (5), a stable sandwich arrangement is obtained from the two components provided in step (1) with the solder, thermally conductively, electrically conductively and mechanically connecting the two components situated therebetween. This solder is a braze joint.

INVENTIVE EXAMPLE 1

On the copper surface of a DCB substrate (alumina ceramic, 25 mm×25 mm×380 μm, on both sides on the square surfaces equipped with 300 μm copper), a solder preform (Sn3.5Ag, melting temperature 221° C.; 9 mm×9 mm×0.20 mm) was placed in the middle and a Si-chip (SKCD 81 C 060 I3) fittingly on top of it, and the resulting sandwich arrangement is put between the two plates of a hot presser, preheated to 150° C. (Sinterstar Innovate F-XL of the Boschmann Company). For a period of 60 seconds, a pressing pressure of 100 MPa was applied to the sample.

By means of a MITUTOYO ABSOLUTE Digimatic dial gauge, the thickness reduction of the former solder preform was determined.

The shear strength of the sample was measured by means of a DAGE 4000 plus shear tester of the Nordson Company at a speed of 0.3 mm/s at 20° C.

Examples 2 to 14 were carried out analogously to Example 1.

The following table shows the influences of pressing temperature, pressing time and pressing pressure during hot pressing.

(2) producing a sandwich arrangement of the components and a solder preform arranged between them and thus not yet connected to them, by bringing into contact (i) each one of the contact surfaces, (ii) each of the single contact surface of the components or (iii) one of the contact surfaces of one component and a single contact surface of the other component, with the contact surfaces of the free solder preform, and (3) hot-pressing the sandwich arrangement produced in step (2) so as to form the stable sandwich arrangement, wherein the melting temperature of the solder metal of the free solder preform is in a range of 140 to 380° C. and the temperature during the hot-pressing is in a range of 84 to 342° C., the free solder preform has an original thickness of 10 to 500 μm, and a combination of a pressing pressure in a range of 10 to 200 MPa and a pressing time in a range of 1 second to 5 minutes of the hot-pressing step (3) causes a reduction of the original thickness of the free solder preform by ≤10%.

2. The method of claim 1, wherein each of the two components is selected from the group consisting of substrates, active components, and passive components.

3. The method of claim 1, wherein the free solder preform is a solder metal foil, solder metal tape or solder metal plate.

4. The method of claim 1, comprising the further steps:

(4) heating the stable sandwich arrangement to a temperature above the melting temperature of the solder metal of the solder joint connecting the two components, and (5) cooling the sandwich arrangement to below the solidification temperature of the molten solder metal, situated between the components, so as to form a braze joint between the components.

5. The method of claim 1, wherein the tin-rich alloy comprises a metal selected from the group consisting of copper, silver, indium, germanium, nickel, lead, bismuth and antimony.

6. The method of claim 1, wherein the tin-rich alloy is lead-free.

7. The method of claim 1, wherein the tin-rich alloy is selected from group consisting of SnAg alloys, SnBi alloys,

| Example | Pressing temperature (° C.) | Pressing pressure (MPa) | Pressing time (s) | Thickness reduction (μm) | Transportability (Shear strength >0.1 MPa) | Re-soldering required (shear strength <10 MPa) |
|---|---|---|---|---|---|---|
| 1 (inv.) | 150 | 100 | 60 | 1 | yes | yes |
| 2 (inv.) | 150 | 100 | 120 | 2 | yes | no |
| 3 (inv.) | 150 | 100 | 300 | 5 | yes | no |
| 4 (inv.) | 190 | 100 | 60 | 2 | yes | no |
| 5 (inv.) | 190 | 100 | 120 | 8 | yes | no |
| 6 (inv.) | 190 | 100 | 300 | 22 | yes | no |
| 7 (inv.) | 150 | 50 | 120 | 0 | yes | yes |
| 8 (not inv.) | 150 | 50 | 60 | 0 | no | — |
| 9 (not inv.) | 150 | 50 | 10 | 0 | no | — |
| 10 (inv.) | 150 | 50 | 300 | 2 | yes | no |
| 11 (inv.) | 190 | 50 | 120 | 5 | yes | no |
| 12 (inv.) | 190 | 50 | 60 | 1 | yes | no |
| 13 (not inv.) | 190 | 50 | 10 | 0 | no | — |
| 14 (inv.) | 190 | 50 | 300 | 6 | yes | no |

The invention claimed is:

1. A method for producing a stable sandwich arrangement of two components with solder situated therebetween, comprising the steps of:

(1) providing two components, each having at least one contact surface, and a free solder preform made of a solder metal, the solder metal being a tin-rich alloy having a tin content in a range of 90 to 99.5% by weight, SnSb alloys, SnAgCu alloys, SnCu alloys, SnSb alloys, InSnCd alloys, InBiSn alloys, InSn alloys, BiSnAg alloys, and SnAgCuBiSbNi alloys.

8. The method of claim 1, wherein the tin-rich alloy is an SnPb alloy or an SnPbAg alloy.

9. A method for producing a stable sandwich arrangement of two components with solder situated therebetween, comprising the steps of:
  (1) providing two components, each having at least one contact surface, and a free solder preform made of a solder metal, the solder metal being a tin-rich alloy having a tin content in a range of 90 to 99.5% by weight,
  (2) producing a sandwich arrangement of the components and a solder preform arranged between them and thus not yet connected to them, by bringing into contact (i) each one of the contact surfaces, (ii) each of the single contact surface of the components or (iii) one of the contact surfaces of one component and a single contact surface of the other component, with the contact surfaces of the free solder preform, and
  (3) hot-pressing the sandwich arrangement produced in step (2) so as to form the stable sandwich arrangement at a temperature being at 10 to 40% below the melting temperature of the solder metal of the free solder preform,
 wherein a combination of a pressing pressure in a range of 10 to 200 MPa and a pressing time in a range of 1 second to 5 minutes of the hot-pressing step (3) causes a reduction of an original thickness of the free solder preform by ≤10%.

10. The method of claim 9, wherein each of the two components is selected from the group consisting of substrates, active components, and passive components.

11. The method of claim 9, wherein the free solder preform is a solder metal foil, solder metal tape or solder metal plate.

12. The method of claim 9, wherein the original thickness of the free solder preform is 10 to 500 μm.

13. The method of claim 9, wherein the melting temperature of the solder metal of the free solder preform is in the range of 140 to 380° C.

14. The method of claim 9, wherein the melting temperature of the solder metal of the free solder preform is in the range of 140 to 380° C. and the temperature during the hot-pressing is in the range of 84 to 342° C.

15. The method of claim 9, comprising the further steps:
  (4) heating the stable sandwich arrangement to a temperature above the melting temperature of the solder metal of the solder joint connecting the two components, and
  (5) cooling the sandwich arrangement to below the solidification temperature of the molten solder metal, situated between the components, so as to form a braze joint between the components.

16. The method of claim 9, wherein the tin-rich alloy comprises a metal selected from the group consisting of copper, silver, indium, germanium, nickel, lead, bismuth and antimony.

17. The method of claim 9, wherein the tin-rich alloy is lead-free.

18. The method of claim 9, wherein the tin-rich alloy is selected from group consisting of SnAg alloys, SnBi alloys, SnSb alloys, SnAgCu alloys, SnCu alloys, SnSb alloys, InSnCd alloys, InBiSn alloys, InSn alloys, BiSnAg alloys, and SnAgCuBiSbNi alloys.

19. The method of claim 9, wherein the tin-rich alloy is an SnPb alloy or an SnPbAg alloy.

\* \* \* \* \*